(12) United States Patent
Yoshida et al.

(10) Patent No.: US 10,903,077 B2
(45) Date of Patent: Jan. 26, 2021

(54) METHODS TO PROTECT NITRIDE LAYERS DURING FORMATION OF SILICON GERMANIUM NANO-WIRES IN MICROELECTRONIC WORKPIECES

(71) Applicant: Tokyo Electron Limited, Tokyo (JP)

(72) Inventors: Yusuke Yoshida, Albany, NY (US);
Christopher Catano, Albany, NY (US);
Christopher Talone, Albany, NY (US);
Nicholas Joy, Albany, NY (US);
Sergey Voronin, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/511,745

(22) Filed: Jul. 15, 2019

(65) Prior Publication Data

US 2020/0027736 A1    Jan. 23, 2020

Related U.S. Application Data

(60) Provisional application No. 62/698,430, filed on Jul. 16, 2018, provisional application No. 62/729,047, filed on Sep. 10, 2018.

(51) Int. Cl.
*H01L 21/00* (2006.01)
*H01L 29/00* (2006.01)
(Continued)

(52) U.S. Cl.
CPC .... *H01L 21/0334* (2013.01); *H01L 21/02532* (2013.01); *H01L 21/02603* (2013.01);
(Continued)

(58) Field of Classification Search
CPC ........... H01L 21/0334; H01L 21/02603; H01L 21/823431; H01L 21/02532; H01L 21/11568; H01L 21/31053; H01L 21/76819; H01L 21/8221; H01L 29/6681; H01L 29/42392; H01L 29/161; H01L 29/0669; H01L 29/66439; H01L 29/78696; H01L 29/66742; H01L 29/78684;
(Continued)

(56) References Cited

U.S. PATENT DOCUMENTS 7,804,127 B2 * 9/2010 Takaya ................. H01L 27/115
257/324
9,502,518 B2 * 11/2016 Liu .................... H01L 29/42364
(Continued)

*Primary Examiner* — Nikolay K Yushin
(74) *Attorney, Agent, or Firm* — Rothwell, Figg, Ernst & Manbeck, P.C.

(57) ABSTRACT

Embodiments are described herein that form silicon germanium nano-wires while reducing or eliminating erosion of nitride layers (e.g., masks and spacers) caused during selective etching of silicon with respect to silicon germanium during formation of silicon germanium nano-wires. oxide layers are used to protect nitride layers during formation of silicon germanium (SiGe) nano-wires. In particular, multilayer spacers including oxide/nitride/oxide layers are formed to protect the nitride layers during selective silicon etch processes that are used to form silicon germanium nano-wires, for example, for field effect transistors (FETs). The multilayer spacers allow for target levels of erosion to be achieved for the nitride layers.

24 Claims, 9 Drawing Sheets

(51) Int. Cl.
   *H01L 21/033*     (2006.01)
   *H01L 29/161*     (2006.01)
   *H01L 29/06*      (2006.01)
   *H01L 21/8234*    (2006.01)
   *H01L 21/02*      (2006.01)
   *H01L 29/66*      (2006.01)

(52) U.S. Cl.
   CPC .. *H01L 21/823431* (2013.01); *H01L 29/0669* (2013.01); *H01L 29/161* (2013.01); *H01L 29/6681* (2013.01)

(58) Field of Classification Search
   CPC ............. H01L 29/792; H01L 29/66823; H01L 29/66545; H01L 29/513; H01L 29/40117; H01L 29/42324; H01L 29/66825; B82Y 10/00; B82Y 20/00; B82Y 30/00; B82Y 40/00
   See application file for complete search history.

(56) References Cited

U.S. PATENT DOCUMENTS

2009/0045454 A1*  2/2009  Takaya .............. H01L 27/11568
                                                       257/324
2015/0372104 A1* 12/2015  Liu ........................ B82Y 10/00
                                                        257/77

* cited by examiner

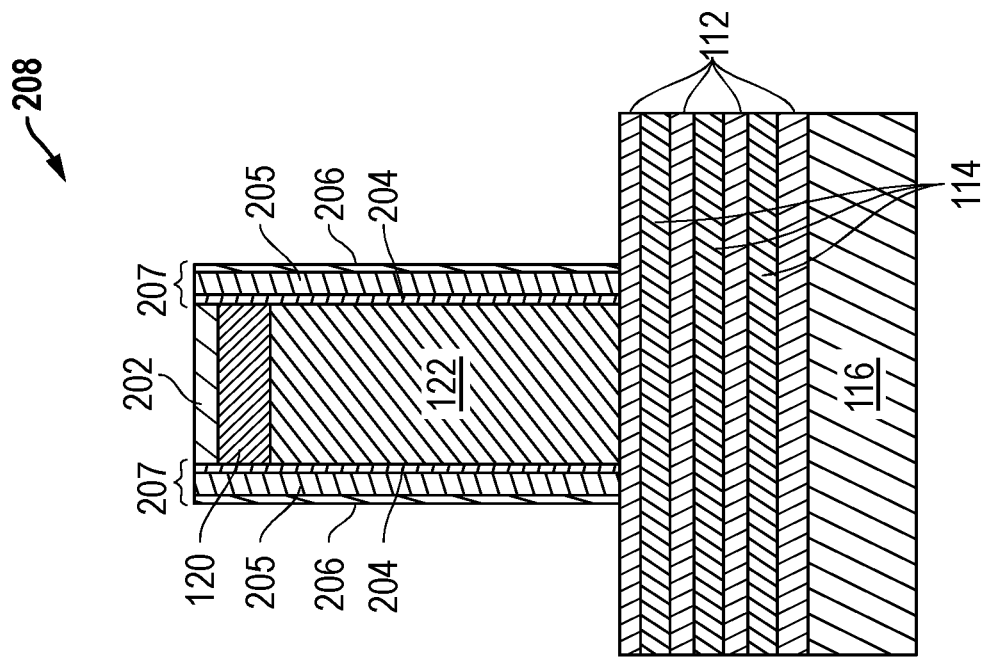
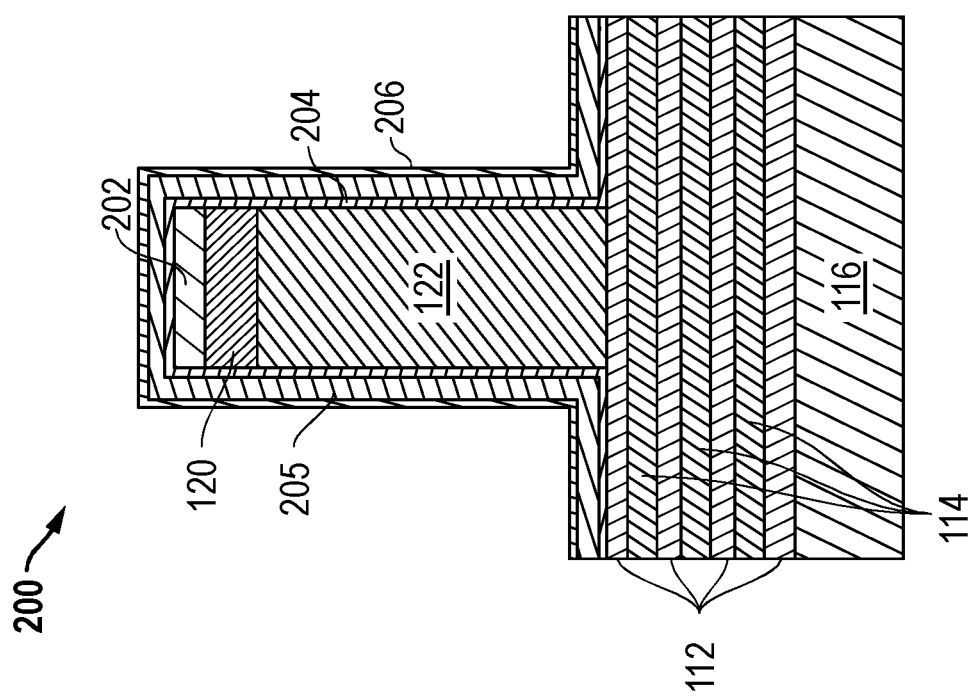

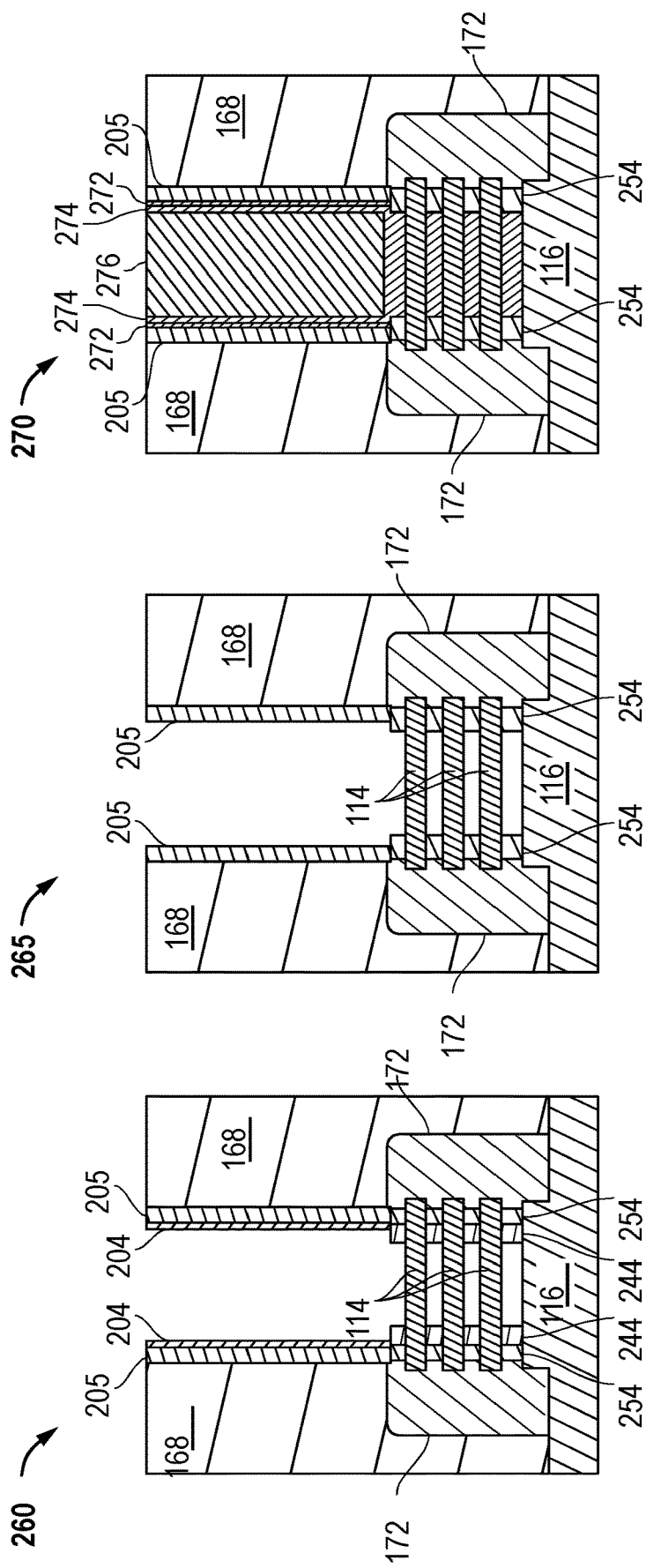

US 10,903,077 B2

METHODS TO PROTECT NITRIDE LAYERS DURING FORMATION OF SILICON GERMANIUM NANO-WIRES IN MICROELECTRONIC WORKPIECES

RELATED APPLICATIONS

This application claims priority to the following provisional applications: U.S. Provisional Patent Application Ser. No. 62/698,430, filed Jul. 16, 2018, and entitled "METHODS TO PROTECT NITRIDE LAYERS DURING FORMATION OF SILICON GERMANIUM NANO-WIRES IN MICROELECTRONIC WORKPIECES," and U.S. Provisional Patent Application Ser. No. 62/729,047, filed Sep. 10, 2018, and entitled "METHODS TO PROTECT NITRIDE LAYERS DURING FORMATION OF SILICON GERMANIUM NANO-WIRES IN MICROELECTRONIC WORKPIECES," which are hereby incorporated by reference in their entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. For certain semiconductor devices formed on microelectronic workpieces, silicon nano-wires are formed to fabricate the semiconductor devices. For silicon nano-wire formation, multi-layer stacks of silicon and silicon germanium is commonly used. These multilayer stacks are formed first by vertical etch processes, and then sacrificial silicon germanium layers are laterally etched selective to silicon to form suspended silicon nano-wires.

For the silicon germanium nano-wire formation, silicon within stacked fin layers is etched laterally selective to silicon germanium. However, one of the key challenges for selective silicon etching to silicon germanium is selectivity to nitride layers that are commonly used as hard masks and as spacers. For example, nitride hard masks and/or spacers are often used as a protective layer between gate and source-drain regions for nano-wire field effect transistors (FETs). In addition, as indicated above, it is understood that the nitride masks and spacers can also contain additive elements such as boron, carbon, and/or oxygen. Due to poor selectivity to nitride in standard processes, significant erosion including recesses and pin holes often occur within the nitride masks and spacers during the lateral silicon etching. These recesses and pin holes can cause severe defects such as irregular epitaxial growth of source/drain materials and electrical shorts between gate and source/drain. For conventional process flows, however, there exists no proven method for silicon germanium nano-wire formation due to the nitride erosion during silicon etch selective to silicon germanium.

FIGS. 1A-B (Prior Art) provide example embodiments based upon conventional process flows wherein erosion to nitride masks and/or spacers occur during selective silicon etching. For example, nitrogen oxide (NO) is typically considered a key component for selective etching of silicon (Si) to silicon germanium (SiGe), but NO also enhances nitride (SiN) etching. This enhanced nitride etching causes undesired erosion of nitride mask and spacer structures.

Looking first to FIG. 1A (Prior Art), example process flow diagrams are shown that are based upon conventional processes where selective etching of silicon for silicon germanium nano-wire formation causes erosion in nitride layers such as nitride hard mask and spacer structures. In particular, nitride spacer erosion and nitride mask erosion occur during Si indentation through a lateral selective etch of the Si layers with respect to the SiGe layers. View 100 represents the multilayer structure before the selective silicon etching, and view 110 represents the multilayer structure after the selective silicon etching as indicated by arrow 105.

As shown in view 100, the Si layers 112 and the SiGe layers 114 are stacked as part of fin layers for a multilayer structure that can be used to form a nano-wire field effect transistor (FET). The multilayer structure includes the Si and SiGe layers 112/114 formed on a substrate 116, a dummy gate 122, nitride spacers 125, and a nitride hard mask 120. It is noted, for example, that the dummy gate can be made of silicon although other dummy gate material could also be used. Other variations could also be implemented within the multilayer structure.

As shown in view 110, the selective Si to SiGe etching as indicated by arrow 105 causes erosion within the nitride mask/spacer layers as shown with respect to the nitride hard mask 120 and the nitride spacers 125. As such, SiGe nano-wires have been formed from SiGe layers 114 through the selective lateral etch of the Si layers 112. However, undesired erosion has occurred within the nitride mask 120 and spacers 125 due to sensitivity of nitride to typical Si-to-SiGe selective etch chemistries, such as those that use NO to provide the selective silicon etching.

FIG. 1B (Prior Art) provides example process flow diagrams based upon conventional processes where a SiGe nano-wire (NW) release process is subsequently performed during formation of a SiGe nano-wire FET. This release process removes the Si layers 112 and leaves the SiGe layers 114 as exposed nano-wires. This NW release process, however, leads to erosion of the nitride spacers 125 on the edges of the exposed area after pull of the dummy gate 122 shown in FIG. 1A (Prior Art). View 150 represents the multilayer structure before the selective silicon etching to remove the Si layers 112, and view 160 represents the multilayer structure after the selective silicon etching as indicated by arrow 155.

As shown in view 150, nitride spacers 174 have also been added between the SiGe layers 114 to fill in the laterally etched regions of the Si layers 112. In addition, source and drain regions 172 have also been added, and these source/drain regions 172 can be formed, for example, using doped SiGe and/or another conductive material. Oxide protective layers 168 have also been formed. In addition, where erosion occurred in nitride spacers 125 as shown in view 110 of FIG. 1A (Prior Art), a redeposit of nitride spacers 125 can be used to reform nitride spacers 125, as shown in view 150, prior to the SiGe nano-wire release process as indicated by arrow 155.

As shown in view 160, the selective Si to SiGe etching as indicated by arrow 155 causes erosion within the nitride spacer layers as shown with respect to the nitride spacers 125. As such, SiGe nano-wires have been released in the SiGe layers 114 through the selective etch of the Si layers 112. However, undesired erosion has occurred within the nitride spacers 125 due to sensitivity of nitride to typical Si-to-SiGe selective etch chemistries, such as those that use NO to provide the selective silicon etching.

SUMMARY

Embodiments are described herein that form silicon germanium nano-wires while reducing or eliminating erosion of nitride layers (e.g., masks and spacers) caused during selective etching of silicon with respect to silicon germanium during formation of silicon germanium nano-wires. As described herein, oxide layers (e.g., $SiO_2$) are used to protect nitride layers (e.g., SiN) during formation of silicon germanium (SiGe) nano-wires. In particular, multilayer spacers including oxide/nitride/oxide layers are formed to protect the nitride layers during silicon etch back processes that are used to form the silicon germanium nano-wires. As such, target levels of erosion are achieved for the nitride layers. Different or additional features, variations, and embodiments can also be implemented, and related systems and methods can be utilized as well.

For one embodiment, a method to process microelectronic workpieces is disclosed including providing a substrate with a dummy gate and an underlying layer including fin layers including silicon layers and silicon germanium layers, forming multilayer spacers to protect the dummy gate, and performing a lateral recess etch of the silicon layers within the fin layers where the lateral recess etch is a selective etch of silicon to silicon germanium and where the multilayer spacers include an inner oxide layer, a nitride layer, and an outer oxide layer.

In additional embodiments, the inner oxide layer and the outer oxide layer include silicon dioxide ($SiO_2$), and the nitride layer includes silicon nitride (SiN). For further embodiments, at least one of the inner oxide layer, the outer oxide layer, or the nitride layer include one or more additional elements. For still further embodiments, the additional elements include at least one of boron, carbon, or oxygen.

In additional embodiments, a target level of erosion for the nitride layer is achieved during the lateral recess etch as a result of protection provided by the outer oxide layer.

In additional embodiments, the method further includes forming a multilayer cap structure to protect the dummy gate prior to the forming of the multilayer spacers, and the multilayer cap structure includes a nitride hard mask and an oxide cap. In further embodiments, the multilayer cap structure is exposed prior to the performing of the lateral recess etch.

In additional embodiments, the method also includes performing an etch back of the multilayer spacers prior to performing the lateral recess etch. In additional embodiments, an etch chemistry for the lateral recess etch includes nitrogen oxide.

In additional embodiments, the method also includes forming an oxide spacer layer after the lateral recess etch and performing an etch back of the oxide spacer layer to expose the silicon germanium layers and to leave oxide spacers between the silicon germanium layers. In further embodiments, the method also includes forming a nitride spacer layer and performing an etch back of the nitride spacer layer to leave nitride spacers between the silicon germanium layers. In still further embodiments, the silicon germanium layers are formed as part of a field effect transistor (FET). In further embodiments, the method includes forming source and drain regions for the FET. In still further embodiments, the source and drain regions are formed as epitaxial growth regions.

In additional embodiments, the method also includes pulling the dummy gate to expose the fin layers including the silicon layers and silicon germanium layers. In further embodiments, the dummy gate is a silicon dummy gate. In further embodiments, the method also includes, performing a planarization process prior to the pulling of the dummy gate.

In additional embodiments, the method includes performing a layer removal etch of the silicon layers within the exposed fin layers to leave exposed silicon germanium nano-wires, where the layer removal etch is a selective etch of silicon to silicon germanium. In further embodiments, a target level of erosion for the nitride layer is achieved during the layer removal etch as a result of protection provided by the inner oxide layer. In further embodiments, an etch chemistry for the layer removal etch includes nitrogen oxide. For further embodiments, the method includes performing an oxide etch to remove the inner oxide layer.

For further embodiments, the method includes forming one or more additional layers over the exposed silicon germanium nano-wires. For still further embodiments, the one or more additional layers include at least one of a dielectric layer or a metal layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
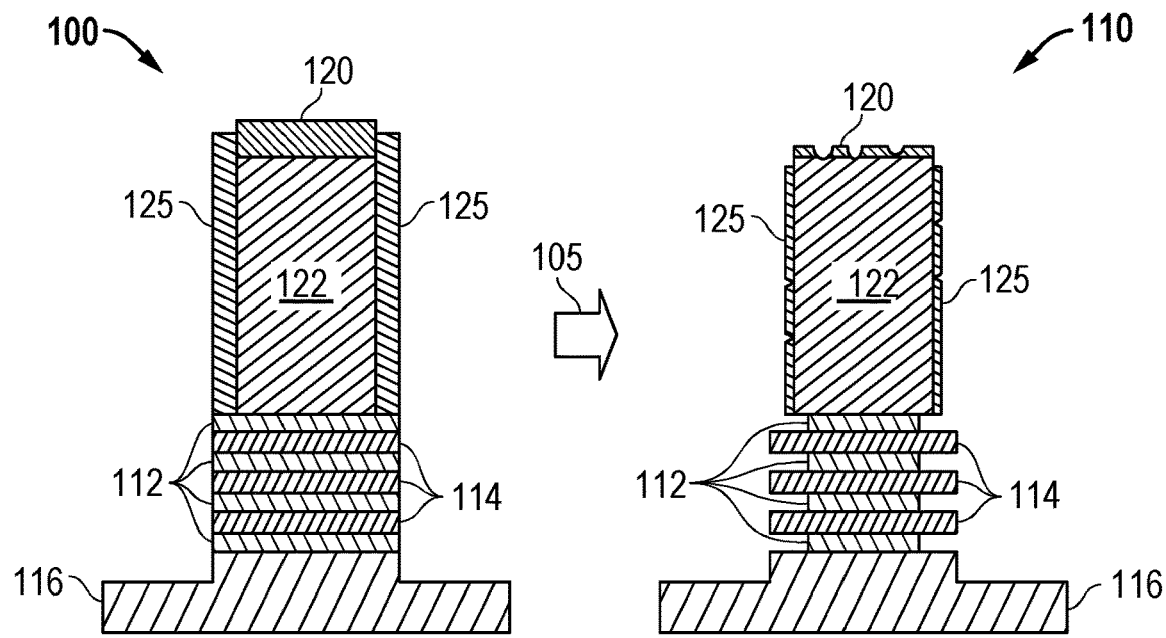
FIGS. 1A-1B illustrate conventional process flows wherein erosion to nitride masks and/or spacers occur during selective silicon etching.
Figure 1B:
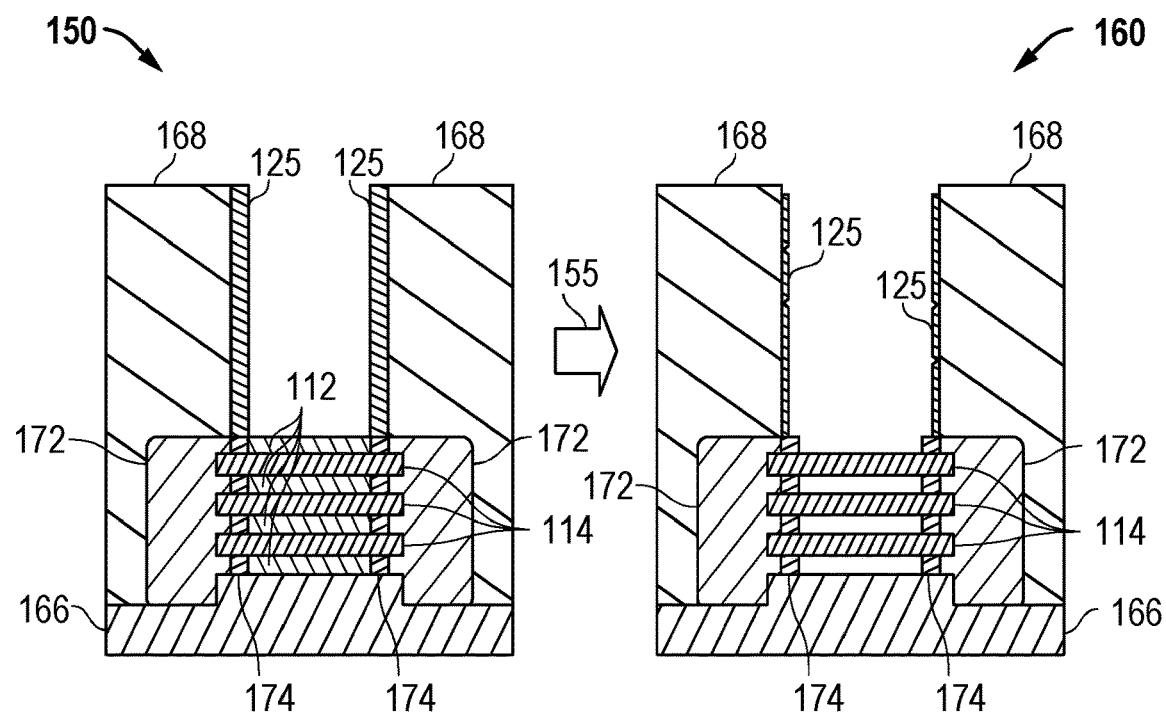

As described herein, methods are disclosed to protect nitride layers during formation of silicon germanium nano-wires in the fabrication of microelectronic workpieces. As described herein, stacked silicon germanium nano-wires are formed from fin layers of silicon and silicon germanium formed on a substrate for a microelectronic workpiece. These silicon germanium nano-wires can be formed, for example, as part of nano-wire field effect transistors (FETs) and more particularly as part of p-channel nano-wire FETs where higher performance can be achieved using such structures. As further described herein, oxide layers (e.g., $SiO_2$) are used to form multilayer structures of oxide/nitride/ oxide that protect the nitride layers (e.g., SiN) during selective silicon etching of stacked silicon (Si) and silicon germanium (SiGe) fin layers. It is also noted that nitride layers often include additional elements such as carbon (C), boron (B), oxygen (O), and/or other additives in addition to silicon nitride (SiN). Similarly, it is noted that oxide layers often include additional elements in addition to silicon dioxide ($SiO_2$). Other advantages and implementations can also be achieved while still taking advantage of the process techniques described herein.

As described above with respect to conventional processes, undesired erosion occurs within nitride mask and spacer layers due to sensitivity of nitride to typical Si-to-SiGe selective etch chemistries, such as those that use NO to provide the selective silicon etching. The embodiments disclosed herein provide techniques to reduce or prevent erosion of nitride layers, such as nitride mask and nitride spacer layers, during formation of SiGe nano-wires from selective silicon etching. As such, the disclosed embodiments enable mass production of silicon germanium nano-wires in microelectronic workpieces in a similar way to the formation of silicon nano-wires without suffering from the nitride erosions problems that would occur using conventional processes.

In one embodiment, the methods disclosed herein include formation of multilayer spacers on dummy gate structures (e.g., silicon dummy gates). These multilayer spacers include an inner oxide layer, a nitride layer, and an outer oxide layer. The outer oxide layer protects the silicon nitride spacer during partial lateral recess of sacrificial silicon layers between silicon germanium layers. As described further below, in order to form a silicon nitride spacer on the exposed nano-wire regions, silicon nitride is deposited and partially etched back after partial recess of sacrificial silicon layers between silicon germanium layers. The inner silicon oxide layer protects the silicon nitride spacer during removal of sacrificial silicon layer, for example, after a pull process has removed the silicon dummy gate. It is noted that the inner oxide layer can be formed, for example, by deposition of silicon oxide or surface oxidation of underlying silicon containing material. Other formation techniques could also be used.

For one embodiment, the method includes additional silicon oxide spacer formation prior to the silicon nitride spacer formation. For this embodiment, after the partial recess of silicon sacrificial layers, silicon oxide is deposited and partially etched back. This deposition and etch back is then repeated with silicon nitride to form outer nitride spacers between the Si—Ge layers. The additional silicon oxide layer protects these outer silicon nitride spacers between the Si—Ge layers during the complete removal of sacrificial silicon layers during a nano-wire release process that exposes the silicon germanium nano-wires under the dummy gate pull.

A number of advantages are achieved by the disclosed embodiments. As described herein, silicon nitride erosion is reduced or prevented during silicon selective etching. Silicon selective etching is typically selective to silicon with respect to silicon germanium but is not typically as selective to silicon nitride and tends to erode the nitride. Further, the disclosed embodiments allow formation of silicon germanium nano-wires in a similar way to silicon nano-wire formation, namely: (1) using fin layers including a multi-layer stack of silicon and silicon germanium, (2) using silicon nitride as spacer/mask material even though it is also etched or eroded during a silicon etch selective to silicon germanium, and (3) adding steps for silicon oxide spacer formation and removal to form multilayer structures of oxide/nitride/oxide to protect the silicon nitride masks/spacers during the selective silicon etching. Other advantages and implementations can also be achieved while still taking advantage of the process techniques described herein.

Now looking to FIGS. 2A-O, an example embodiment is further described for a process flow using a multilayer spacer structure of oxide/nitride/oxide layers to protect silicon nitride layers during selective etch of silicon to silicon germanium. Using this multilayer structure of oxide/nitride/oxide layers, a target level of erosion for the silicon nitride layer is achieved during selective etch processes of silicon to silicon germanium due to protection provided by the inner silicon oxide layer and/or the outer silicon oxide layer. Further additional oxide layers can also be used to protect additional nitride spacers formed between silicon germanium layers. It is further noted that the erosion being reduced or prevented includes pin holes and recesses that would otherwise be formed in the silicon nitride layer as is seen in prior solutions.

FIG. 2A is a process diagram for an embodiment 200 where a multilayer spacer structure including oxide/nitride/oxide layers is formed over a dummy gate 122 and fin layers including a stack of Si layers 112 and SiGe layers 114. The dummy gate 122 has been previously formed on top of the multilayer Si and SiGe structure, which have been previously formed on the substrate 116. An oxide cap 202 has also been formed over a nitride hard mask 120 to provide a multilayer cap structure. The nitride hard mask 120 was previously formed over the dummy gate 122. As shown, a multilayer spacer structure of oxide/nitride/oxide layers 204/205/206 is formed over the other structures. For this multilayer spacer structure, an inner oxide layer 204 is first formed over the structures on the substrate including the dummy gate 122 and the fin layers including the stack of Si/SiGe layers 112/114. The nitride layer 205 is then formed over the inner oxide layer 204. The outer oxide layer 206 is then formed over the nitride layer 205. It is noted that the inner oxide layer 204 can be formed, for example, by deposition of silicon oxide or surface oxidation of underlying silicon containing material. Other formation techniques could also be used. It is also noted that nitride layers often include additional elements such as carbon (C), boron (B), oxygen (O), and/or other additives in addition to silicon nitride (SiN). Similarly, it is noted that oxide layers often include additional elements in addition to silicon dioxide ($SiO_2$). Other variations could also be implemented.

FIG. 2B is a process diagram for an example embodiment 208 where a spacer etch back process has been performed to leave the oxide/nitride/oxide layers 204/205/206 as multilayer spacers 207 adjacent the dummy gate 122. For example, one or more etch processes can be performed to leave a stacked structure including the dummy gate 122 and multilayer spacers 207 over the fin layers including Si layers 112 and SiGe layers 114.

Figure 2C:
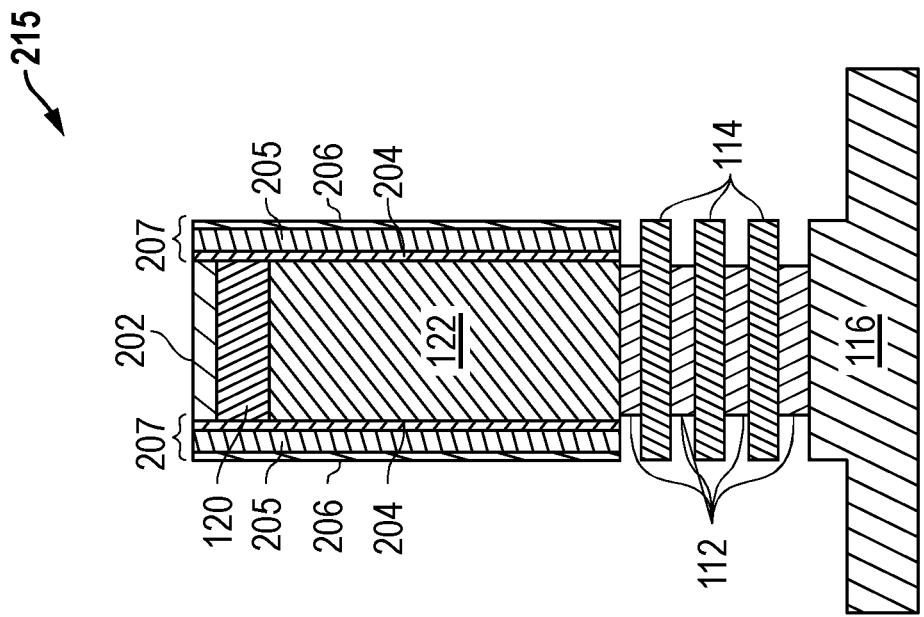
FIGS. 2A-2O illustrate structures resulting from the process steps of this invention.

FIG. 2C is a process diagram for an example embodiment 210 where a fin recess process step has been performed to expose the sides of the fin layers including Si layers 112 and SiGe layers 114. As such, a fin structure is formed where the Si-SiGe fin layers 112/114 are a multilayer structure below the dummy gate 122.

Figure 2D:
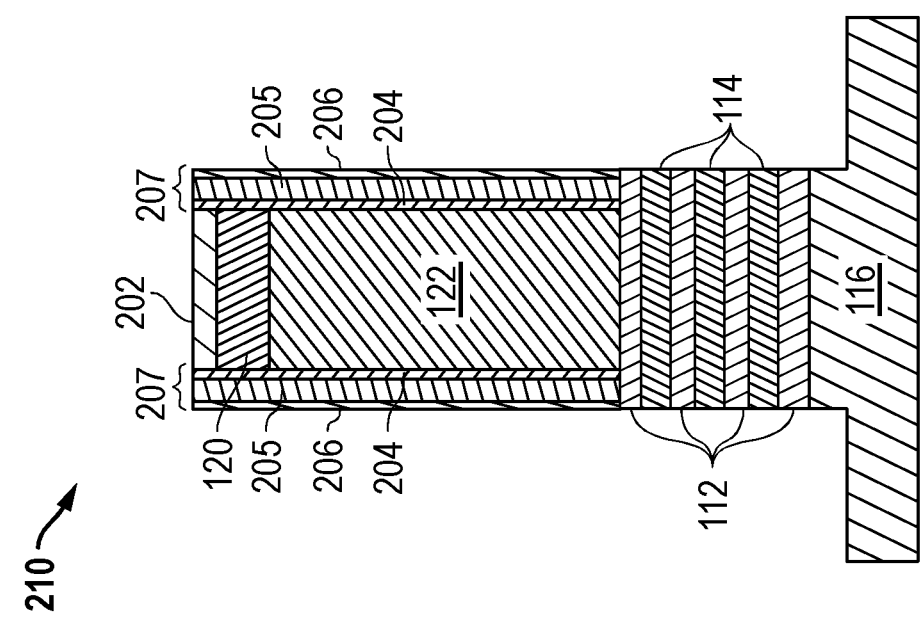

FIG. 2D is a process diagram for an example embodiment 215 where a lateral recess etch process has been performed that is selective to silicon with respect to silicon germanium. Although this lateral selective silicon etch has poor selectivity to SiN that can cause erosion to SiN, as is the case in conventional processes, the SiN layer 205 and the SiN hard mask 120 are protected by the multilayer spacers 207 including the oxide/nitride/oxide layers 204/205/206 as well as by the oxide cap 202. In particular, the outer oxide layer 206 for the multilayer spacers 207 protects the nitride layer 205 that sits between the inner/outer oxide layers 204/206. As one example, the lateral selective etch of the silicon layers 112 includes an etch chemistry having nitrogen oxide (NO) that tends to erode nitride, although other etch chemistries can also be used that are selective to silicon with respect to silicon germanium.

Figure 2F:
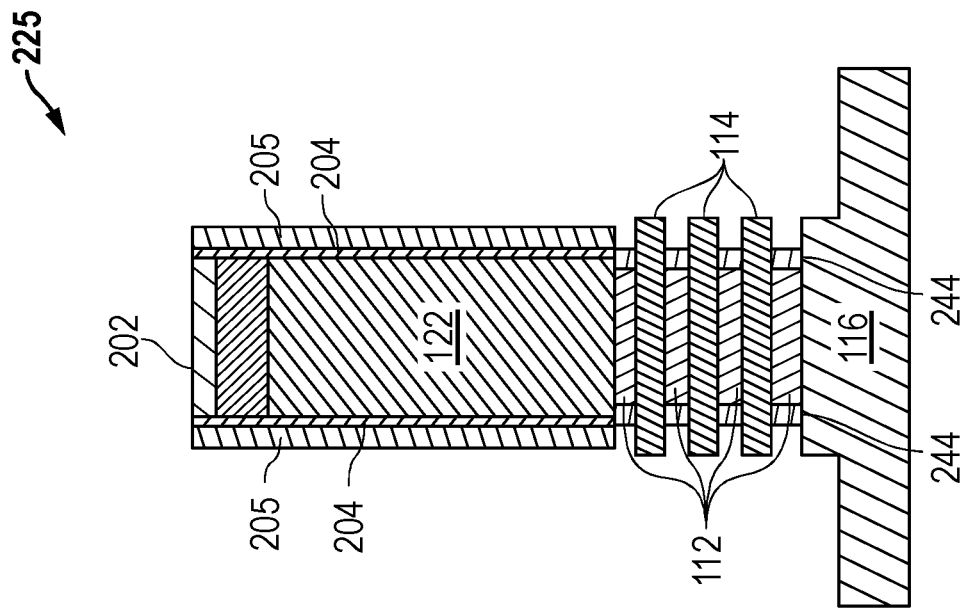
Figure 2E:
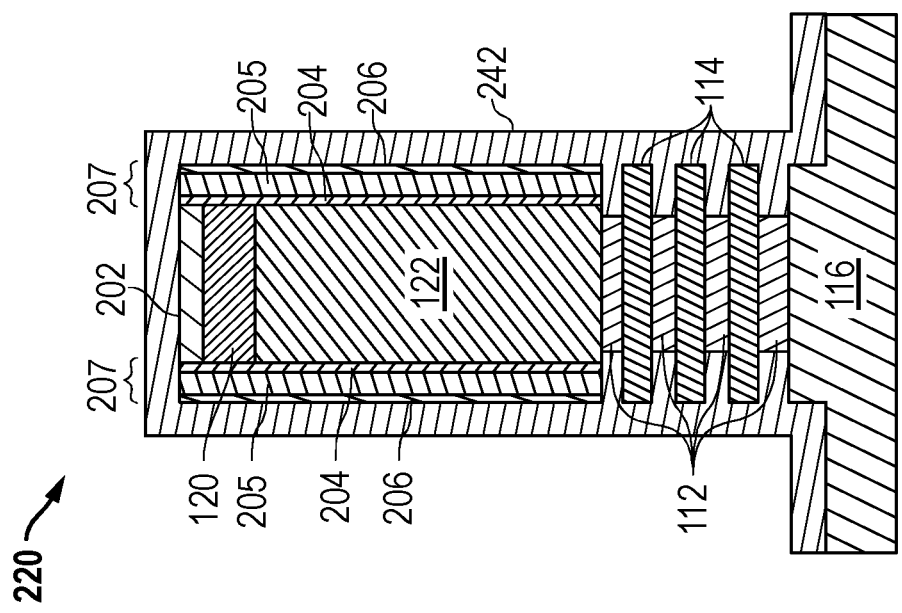

FIG. 2E is a process diagram for an example embodiment 220 where an oxide spacer deposition process has been performed to form an additional oxide layer 242 over the multilayer spacers 207, the dummy gate 122, and the Si-SiGe layers 112/114. It is noted that the outer oxide layer 206 effectively becomes part of the additional oxide layer 242 after this oxide spacer deposition.

FIG. 2F is a process diagram for an example embodiment 225 where an oxide spacer etch back has been performed to remove a portion of the additional oxide layer 242 and leave oxide spacers 244 between the SiGe layers 114. This etch back process can be an isotropic etch. Further, this etch back process can remove the outer oxide layer from the multilayer spacer structure.

Figure 2G:
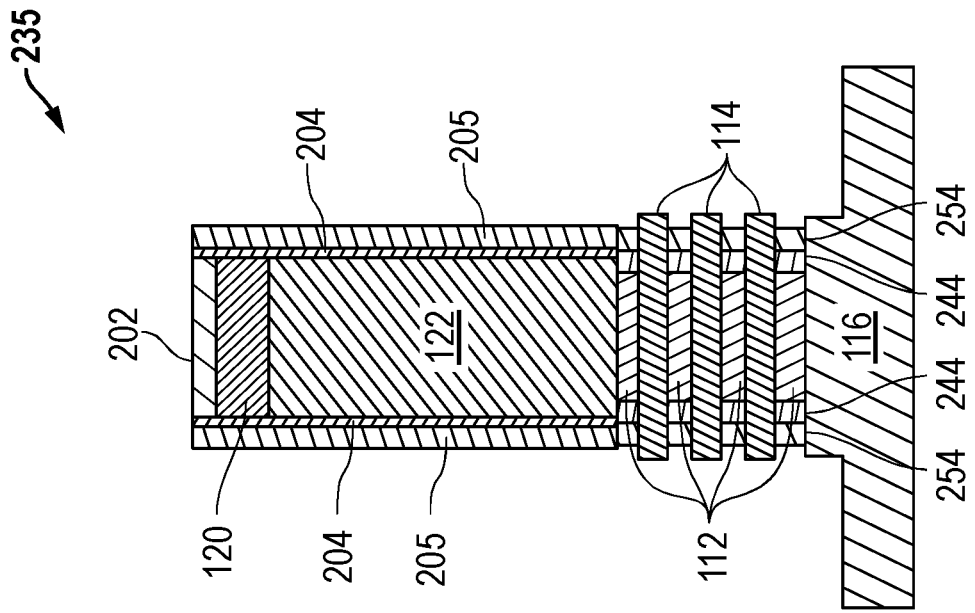

FIG. 2G is a process diagram for an example embodiment 230 where a nitride spacer deposition has been performed to form a nitride spacer layer 252 over the remaining oxide/nitride layers 204/205, the dummy gate 122, and the fin layers including the Si/SiGe layers 112/114. It is noted that the nitride layer 205 effectively becomes part of the nitride spacer layer 252 after this nitride spacer deposition.

Figure 2H:
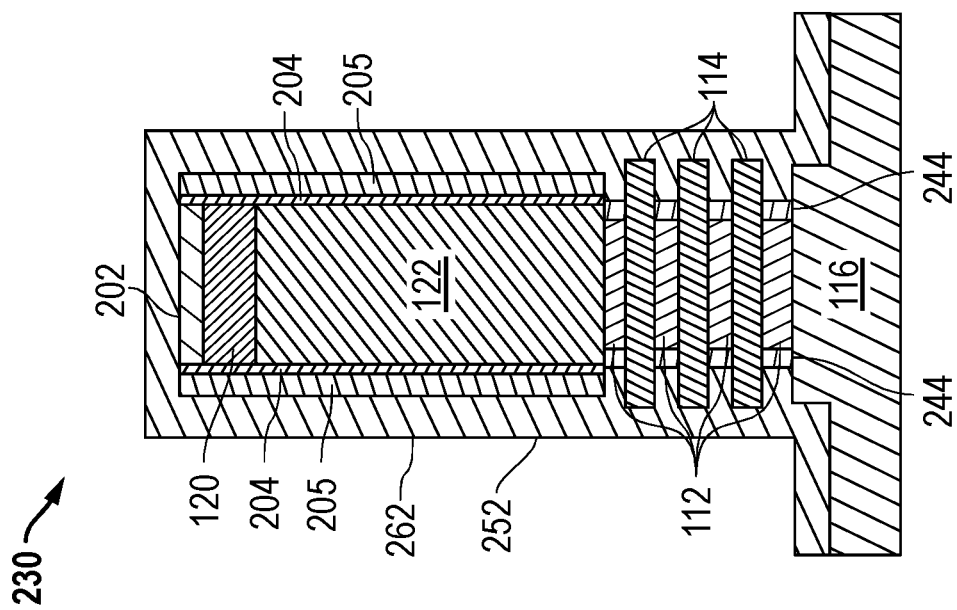

FIG. 2H is a process diagram for an example embodiment 235 where a nitride spacer etch back has been performed to remove a portion of the nitride spacer layer 252 and leave nitride spacers 254 between the SiGe layers 114.

Figure 2I:
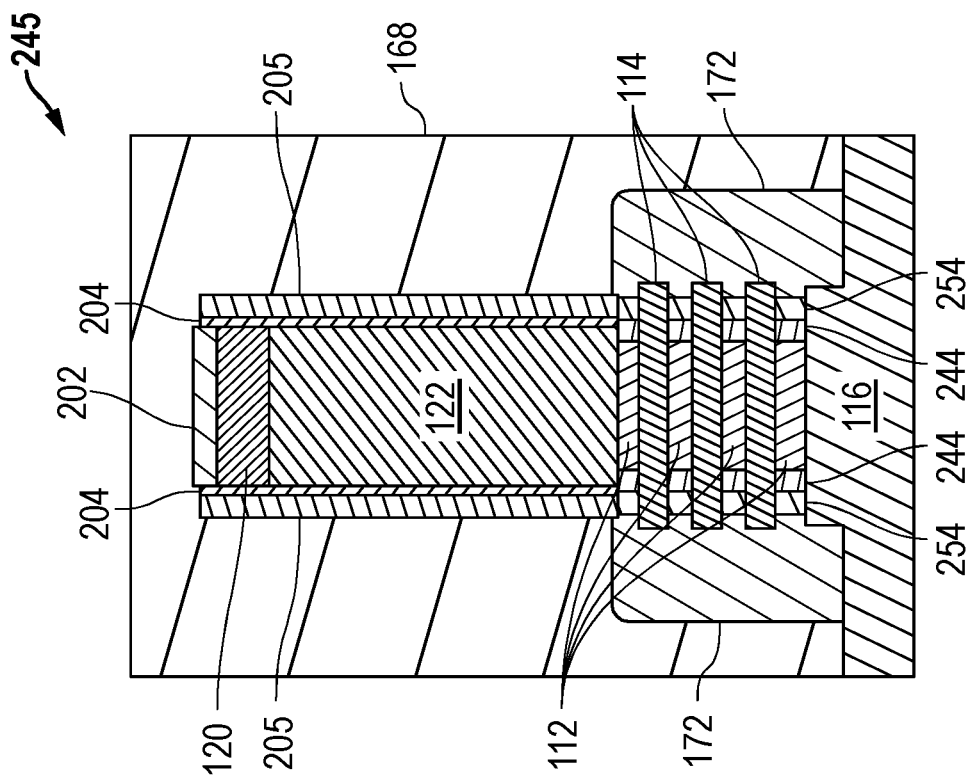

FIG. 2I is a process diagram for an example embodiment 240 where epitaxial growth process has been performed to form epitaxial layers (e.g., silicon epitaxial layer) along with patterning and/or etch processes to form as source and drain regions 172. As shown, these source/drain regions 172 are formed adjacent the fin layers including the Si/SiGe layers 112/114. In addition, a portion of the source/drain regions 172 is formed between the SiGe layers 114 adjacent the nitride spacers 254.

Figure 2J:
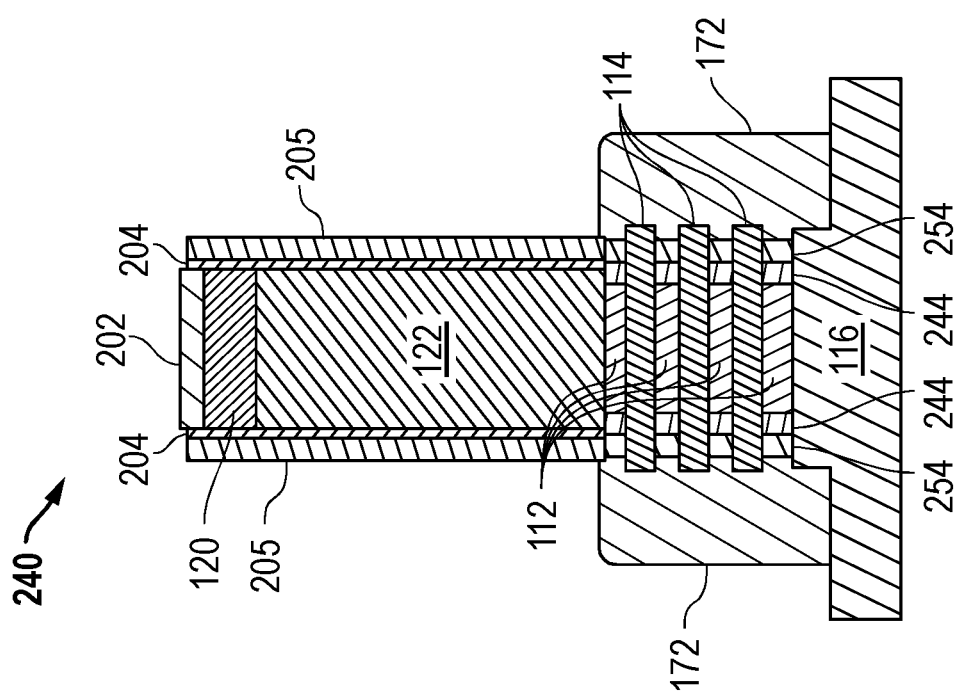

FIG. 2J is a process diagram for an example embodiment 245 where an oxide deposition process has been performed to form an oxide layer 168 over the remaining oxide/nitride layers 204/205, the dummy gate 122, the source/drain regions 172, and the fin layers including the Si/SiGe layers 112/114.

Figure 2K:
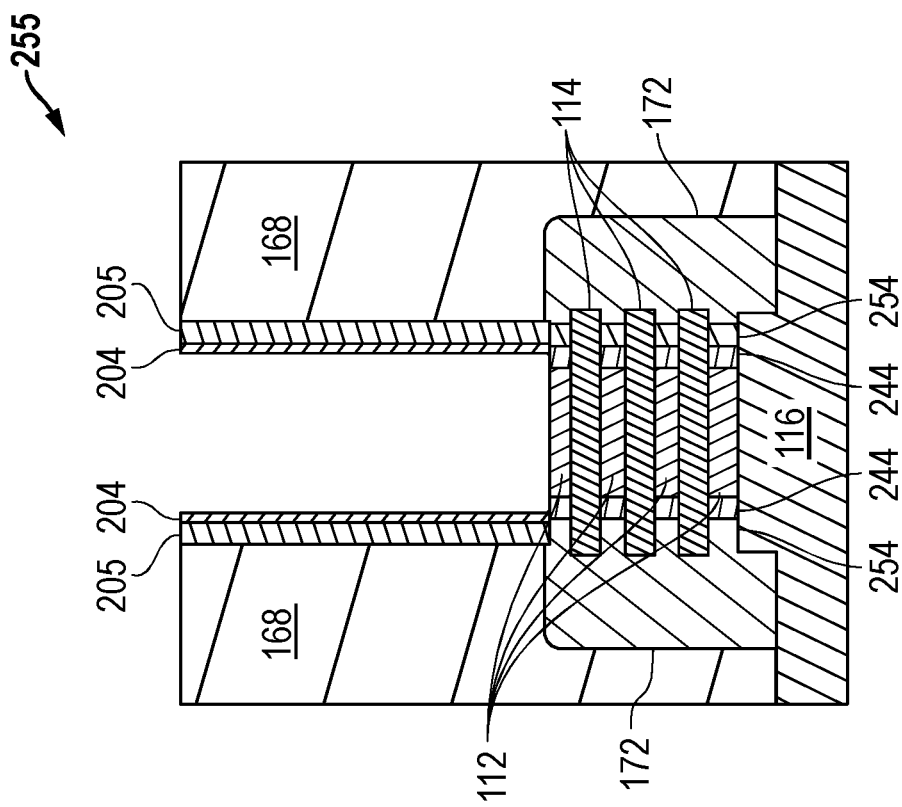

FIG. 2K is a process diagram for an example embodiment 250 where a planarization process, such as a chemical mechanical planarization (CMP), has been performed to planarize the top of the structures in embodiment 245. As shown, the SiN hard mask 120 and the oxide cap 202 can be removed during this planarization process.

Figure 2L:
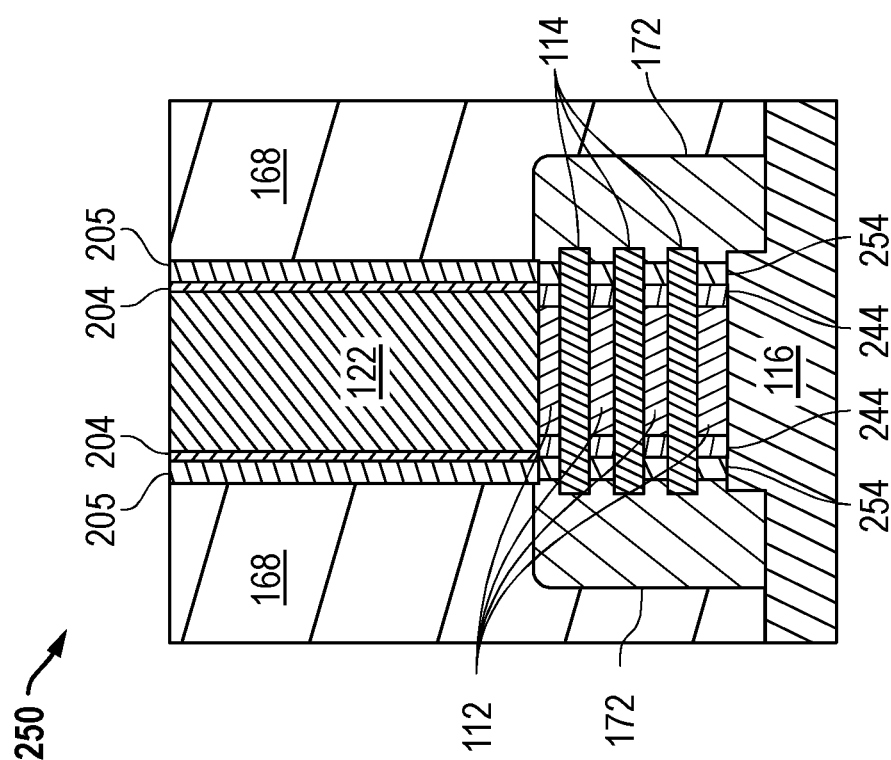

FIG. 2L is a process diagram of an example embodiment 255 where the dummy gate 122 shown in FIG. 2K has been pulled from the structure to expose the fin layers including the Si layers 112 and the SiGe layer 114. As indicated above, the dummy gate 122 can be a silicon dummy gate that is removed in a silicon etch as the pull process.

FIG. 2M is a process diagram of an example embodiment 260 where an etch process has been performed that is selective to Si with respect to SiGe. This silicon selective etch process removes the Si layers 112 in the fin layers for the Si—SiGe multilayer structure to leave the SiGe layers 114 as exposed nano-wires. Although this Si selective etch has poor selectivity to SiN that can cause erosion to nitride as is the case in conventional processes, the nitride layer 205 and the nitride spacers 254 are protected. More particularly, the nitride layers 205 are protected by the inner oxide layers 204 that still remain as part of the multilayer spacers 207 originally formed with oxide/nitride/oxide layers 204/205/206 as shown in FIG. 2B. The nitride spacers 254 are protected by the oxide spacers 244. As one example, the selective layer removal etch of the silicon layers 112 can include an etch chemistry having nitrogen oxide (NO) that tends to erode nitride, although other etch chemistries can also be used that are selective to silicon with respect to silicon germanium.

FIG. 2N is a process diagram where an oxide spacer removal process has been performed with an oxide etch to remove the oxide spacers 244.

FIG. 2O is a process diagram where additional deposition processes have been performed to form one or more additional layers over the exposed SiGe nano-wires formed by the SiGe layers 114. For example, the one or more additional layers can be dielectric layers 272/274, such as high dielectric constant (high-k) layers, a metal layer such as a metal gate plug 276, and/or other desired material layers.

Figure 3:
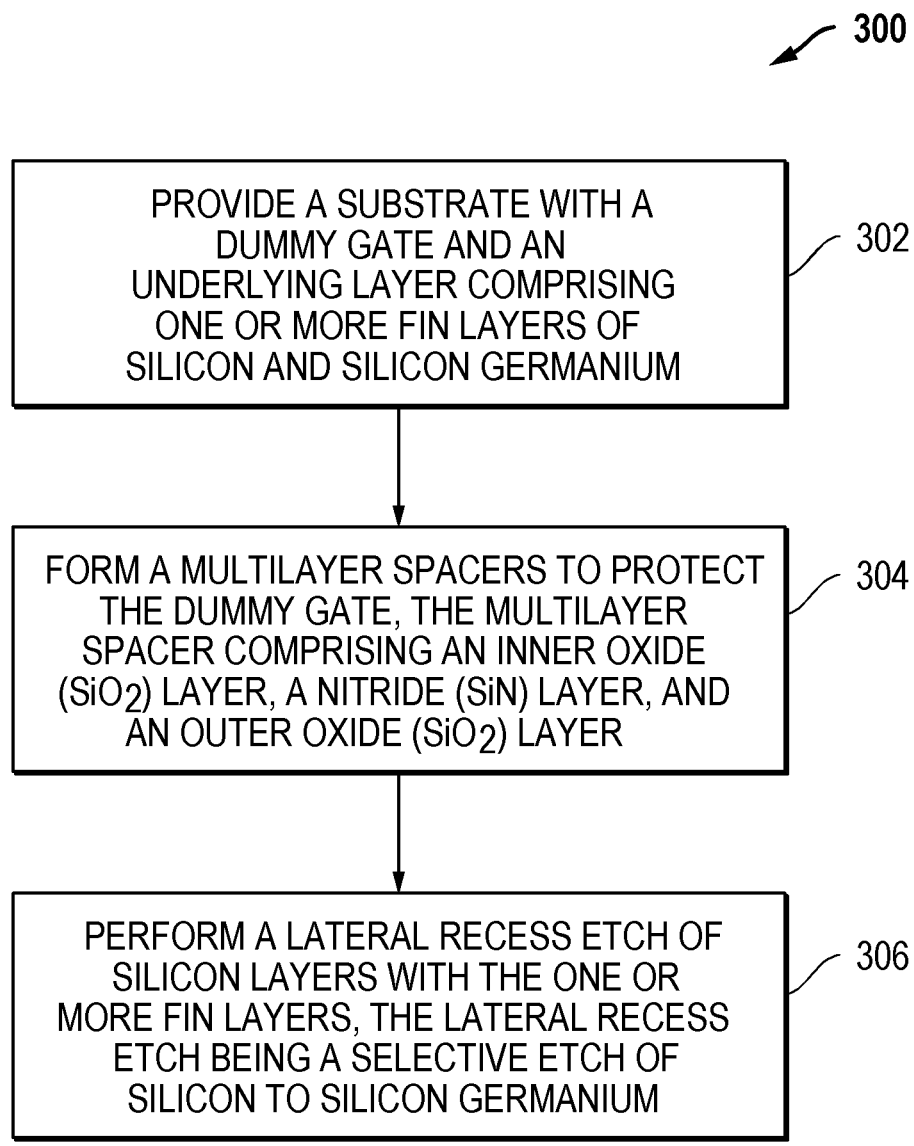
FIG. 3 illustrates a flow diagram of the process of this invention.

FIG. 3 is a process flow diagram of an example embodiment 300 where multilayer spacers including oxide/nitride/oxide layers are formed to protect nitride layers during formation of SiGe nano-wires for the manufacture of microelectronic workpieces. In block 302, a substrate is provided with a dummy gate and an underlying layer including fin layers of silicon and silicon germanium. In block 304, multilayer spacers are formed to protect the dummy gate, and the multilayer spacer structure includes an inner oxide ($SiO_2$) layer, a nitride (SiN) layer, and an outer oxide ($SiO_2$) layer. In block 306, a lateral recess etch of silicon layers within the fin layers is performed, and the lateral recess etch is a selective etch of silicon to silicon germanium. It is further noted that a target level of erosion for the nitride layer can be achieved during the lateral recess etch due to protection provided by the outer oxide layer. Further, during one or more additional process steps the inner oxide layer is used to protect the nitride layer during a selective silicon etch. Still further, additional oxide layers can also be deposited to protect nitride spacers, masks, and/or structures during etch processes that provide a selective etch of silicon to silicon germanium. Additional and/or different process steps could also be used while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to photo resist (PR) layers can be implemented using optical lithography, extreme ultra-violet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to process microelectronic workpieces, comprising:
   providing a substrate with a dummy gate and an underlying layer comprising fin layers including silicon layers and silicon germanium layers;
   forming multilayer spacers to protect the dummy gate, the multilayer spacers comprising an inner oxide layer, a nitride layer, and an outer oxide layer; and
   performing a lateral recess etch of the silicon layers within the fin layers, the lateral recess etch being a selective etch of silicon to silicon germanium,
   wherein a target level of erosion for the nitride layer is achieved during the lateral recess etch as a result of protection provided by the outer oxide layer.

2. A method to process microelectronic workpieces, comprising:
   providing a substrate with a dummy gate and an underlying layer comprising fin layers including silicon layers and silicon germanium layers;
   forming multilayer spacers to protect the dummy gate, the multilayer spacers comprising an inner oxide layer, a nitride layer, and an outer oxide layer;
   performing a lateral recess etch of the silicon layers within the fin layers, the lateral recess etch being a selective etch of silicon to silicon germanium; and
   the method further comprising forming an oxide spacer layer after the lateral recess etch and performing an etch back of the oxide spacer layer to expose the silicon germanium layers and to leave oxide spacers between the silicon germanium layers.

3. The method of claim 2, further comprising forming a nitride spacer layer and performing an etch back of the nitride spacer layer to leave nitride spacers between the silicon germanium layers.

4. The method of claim 3, wherein the silicon germanium layers are formed as part of a field effect transistor (FET).

5. A method to process microelectronic workpieces, comprising:
   providing a substrate with a dummy gate and an underlying layer comprising fin layers including silicon layers and silicon germanium layers;
   forming multilayer spacers to protect the dummy gate, the multilayer spacers comprising an inner oxide layer, a nitride layer, and an outer oxide layer, wherein during the forming of the multilayer spacers the multilayer spacers are formed at locations above the dummy gate and above the underlying layer, and the multilayer spacers are also formed along sides of the dummy gate;
   performing an etch back of the multilayer spacers to remove portions of the multilayer spacers above the dummy gate and above the underlying layer while leaving portions of the multilayer spacers along sides of the dummy gate; and performing a lateral recess etch of the silicon layers within the fin layers, the lateral recess etch being a selective etch of silicon to silicon germanium.

6. The method of claim 5, further comprising forming a cap which includes at least one of an oxide cap or a nitride hard mask above the dummy gate prior to the forming of the multilayer spacers.

7. The method of claim 6, wherein the cap is a multilayer cap structure including both the nitride hard mask and the oxide cap, the method further including, performing the etch back of the multilayer spacers at a location above the multilayer cap structure so that the multilayer cap structure is exposed prior to the performing of the lateral recess etch.

8. The method of claim 5, further including after performing the etch back and prior to performing the lateral etch, performing a fin recess process step to expose sides of the fin layers.

9. The method of claim 8, further including, after the performing the lateral recess etch, forming at least one of an oxide spacer or a nitride spaces to provide at least one of an oxide spacer or a nitride spacer between the silicon germanium layers.

10. The method of claim 5, wherein the inner oxide layer and the outer oxide layer comprise silicon dioxide (SiO2) and the nitride layer comprises silicon nitride (SiN).

11. The method of claim 10, wherein at least one of the inner oxide layer, the outer oxide layer, or the nitride layer comprise one or more additional elements.

12. The method of claim 11, wherein the additional elements comprise at least one of boron, carbon, or oxygen.

13. The method of claim 5, wherein an etch chemistry for the lateral recess etch comprises nitrogen oxide.

14. The method of claim 13, further comprising forming source and drain regions for the FET.

15. The method of claim 14, wherein the source and drain regions are formed as epitaxial growth regions.

16. The method of claim 5, further comprising pulling the dummy gate to expose the fin layers including the silicon layers and silicon germanium layers.

17. The method of claim 16, wherein the dummy gate is a silicon dummy gate.

18. The method of claim 16, further comprising performing a planarization process prior to the pulling of the dummy gate.

19. The method of claim 5, further comprising performing a layer removal etch of the silicon layers within the exposed fin layers to leave exposed silicon germanium nano-wires, the layer removal etch being a selective etch of silicon to silicon germanium.

20. The method of claim 19, wherein a target level of erosion for the nitride layer is achieved during the layer removal etch as a result of protection provided by the inner oxide layer.

21. The method of claim 19, wherein an etch chemistry for the layer removal etch comprises nitrogen oxide.

22. The method of claim 19, further comprising performing an oxide etch to remove the inner oxide layer.

23. The method of claim 19, further comprising forming one or more additional layers over the exposed silicon germanium nano-wires.

24. The method of claim 23, wherein the one or more additional layers comprise at least one of a dielectric layer or a metal layer.

* * * * *